United States Patent [19]
Redinbo et al.

[11] Patent Number: 6,130,105
[45] Date of Patent: *Oct. 10, 2000

[54] DEPOSITION RATE CONTROL ON WAFERS WITH VARYING CHARACTERISTICS

[75] Inventors: Gregory F. Redinbo, Campbell; H. Peter W. Hey, Sunnyvale, both of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/927,103

[22] Filed: Aug. 28, 1997

[51] Int. Cl.[7] ............................. G01R 31/26; H01L 21/66
[52] U.S. Cl. ............................... 438/16; 118/725; 118/667
[58] Field of Search ..................... 438/14, 16; 118/725, 118/641, 666, 667

[56] References Cited

U.S. PATENT DOCUMENTS

| 4,823,291 | 4/1989 | Berman . | |
|---|---|---|---|
| 5,352,636 | 10/1994 | Beinglass | 438/475 |
| 5,418,885 | 5/1995 | Hauser et al. . | |
| 5,508,934 | 4/1996 | Moslehi et al. | 364/468 |
| 5,589,224 | 12/1996 | Tepman et al. | 427/248.1 |
| 5,650,082 | 7/1997 | Anderson | 219/390 |

FOREIGN PATENT DOCUMENTS 195 14 083A1  4/1995  Germany .

OTHER PUBLICATIONS

John M. Stone; "Radiation and Optics, An Introduction to the Clasical Theory"; McGraw–Hill Book Company; 5 pages total.

Ozturk, et al.; "Manufacturability Issues in Rapid Thermal Chemical Vapor Deposition"; *IEEE Transactions on Semiconductor Manufacturing;* vol. 4, No. 2., May 1991; pp. 155–165.

*Primary Examiner*—Jey Tsai
*Assistant Examiner*—John Murphy
*Attorney, Agent, or Firm*—Blakely Sokoloff Taylor & Zafman

[57] ABSTRACT

The present invention is a method and apparatus for depositing a film on a substrate. According to the present invention a characteristic of a substrate is determined. The substrate is then heated by heat from an upper heat source and heat from a lower heat source wherein the ratio of heat supplied from the upper heat source relative to the lower heat source is dependent upon the determined wafer characteristic.

11 Claims, 10 Drawing Sheets

DEPOSITION RATE CONTROL ON WAFERS WITH VARYING CHARACTERISTICS

BACKGROUND OF THE INVENTION

1. Field of the Invention

The present invention relates to the field of semiconductor manufacturing equipment, and more specifically, to an apparatus and method for depositing a film at a rate which is independent of wafer characteristics.

2. Discussion of Related Art

During the manufacture of semiconductor devices, thin films are often formed on a semiconductor wafer surface. A typical processing apparatus 110 for depositing a thin film on a semiconductor wafer is illustrated in FIG. 1A. Processing apparatus 110 will typically include a susceptor 102 located within a chamber 119 on which a wafer or substrate 104 to be processed is placed. The top 106 and bottom 108 of reaction chamber 119 are generally formed of quartz to allow light of the visible and IR frequency from lamps 126 to pass into chamber 119 and heat susceptor 102 and wafer 104. A non contact temperature measurement device 114, such as a pyrometer, is provided to measure the temperature of susceptor 102. The temperature of wafer 104 is assumed to be at the same temperature of susceptor 102.

Pyrometer 114 senses the amount of radiation emitted from susceptor 102 and provides a related voltage signal to computer 118, from which computer 118 calculates the temperature of susceptor 102. Computer 118 then signals power controller 116 to either increase or decrease the power to lamps 126 in order to increase or decrease the temperature of susceptor 104.

A problem with the above referenced deposition apparatus and method of operation is that the deposition rate for a given process (i.e., constant pressure, power, flow rate, etc.) is dependent upon the specifics of a wafer characteristic. The above referenced deposition apparatus represents an inherently non-equilibrium situation in that the wafer and susceptor are at an elevated temperature with respect to the chamber walls. The extent of the non-equilibrium situation depends on the emissivity of the wafer surface since this determines the heat input versus heat loss from the wafer. Since the growth rate of polysilicon deposition depends strongly on the surface temperature, varying heat losses (in the form of emissivity differences) leads to variations in film thicknesses for different wafers with varying surface characteristics. For example, the deposition rate of a polysilicon film for a given process will depend upon the initial thickness of an oxide grown on the wafer. That is, the polysilicon deposition rate on a wafer having a 1000 Å thick oxide formed thereon will be different than a wafer having a 100 Å thick oxide formed thereon. When the deposition rate of a process varies with specific wafer characteristics, wafer to wafer repeatability suffers and the process is not manufacturable.

Other factors that affect the surface characteristics (and hence the emissivity) are the density of patterns in a thin film on the wafer, film roughness and multiple layers of stacked films. For example, a wafer having a dense pattern of electrodes or vias across the surface will have a different deposition rate than a wafer with a less dense pattern. Similarly, wafers having a film with a rough surface will have a deposition rate different than a wafer having a film with a smooth surface. Like different oxide thickness, pattern densities and surface roughness affect the emissivity of the wafer which in turn causes a variation in the surface temperature of the wafer which in turn leads to variations in the deposition rate.

While the wafer is in contact with the above described susceptor, the above surface temperature variation for wafers with different surface characteristics is minimized. However, when the wafer is held at a distance from the susceptor (such as in a "pin" susceptor configuration), the surface temperature variation is exacerbated. This effect can be seen in FIG. 1b where the deposition rate of a given process varies with the surface characteristic of the wafer, in this case an initial oxide thickness variation on the silicon wafer. While the susceptor temperature and susceptor emissivity can be controlled in such a system, the deposition system has no control over the condition of the incoming wafer. Hence, a fixed power distribution that preferentially heats the susceptor with the bottom lamps and the wafer with the top lamps can lead to the effects exhibited in FIG. 1b.

Thus, what is desired is a method and apparatus for depositing a film on wafer wherein the deposition rate is independent of specific wafer characteristics or profiles.

SUMMARY OF THE INVENTION

A method of depositing a film on a substrate is described. According to the present invention, a substrate is placed in a chamber having an upper source of radiant energy and a lower source of radiant energy. A wafer characteristic, such as oxide thickness, pattern density, or surface roughness, is monitored by measuring the radiation emission of the substrate prior to deposition. The wafer is then brought to a deposition temperature by monitoring the temperature of the susceptor. The temperature of the susceptor is monitored to determine whether the Total Power applied to the heat sources should be increased, reduced or maintained. The Total Power is applied to the upper source of radiant energy and to the lower source of radiant energy in an empirically determined ratio which is dependent upon the measured wafer characteristic. By applying different ratios of the total power for different wafer characteristics, the deposition rate of a process is made independent of wafer characteristics.

BRIEF DESCRIPTION OF THE DRAWINGS

FIG. 8b is an overhead view of the pin susceptor of FIG. 8a.

DETAILED DESCRIPTION OF THE PRESENT INVENTION

The present invention is a method and apparatus for making the deposition rate of a film independent of wafer characteristics. In the following description numerous specific details such as specific processes and reactor features have been described in order to provide a thorough understanding of the present invention. In other cases, however, well known reactor features and methods of operation have not been given in particular detail in order to not unnecessarily obscure the present invention.

According to the present invention, the specific wafer characteristic of each incoming wafer is measured relative to a known, calibrated susceptor temperature of the deposition apparatus. A ratio of heating power from an upper heat source and a lower heat source is then chosen (through a predetermined empirical lookup table) and applied which makes the deposition rate independent of the wafer characteristics. Since the absolute deposition temperature can be calibrated through the known fixed emissivity of the susceptor, the relative adjustment in heat balance from the upper and lower heat source provides a means for constant wafer to wafer deposition rates independent of wafer characteristics.

Figure 1A:
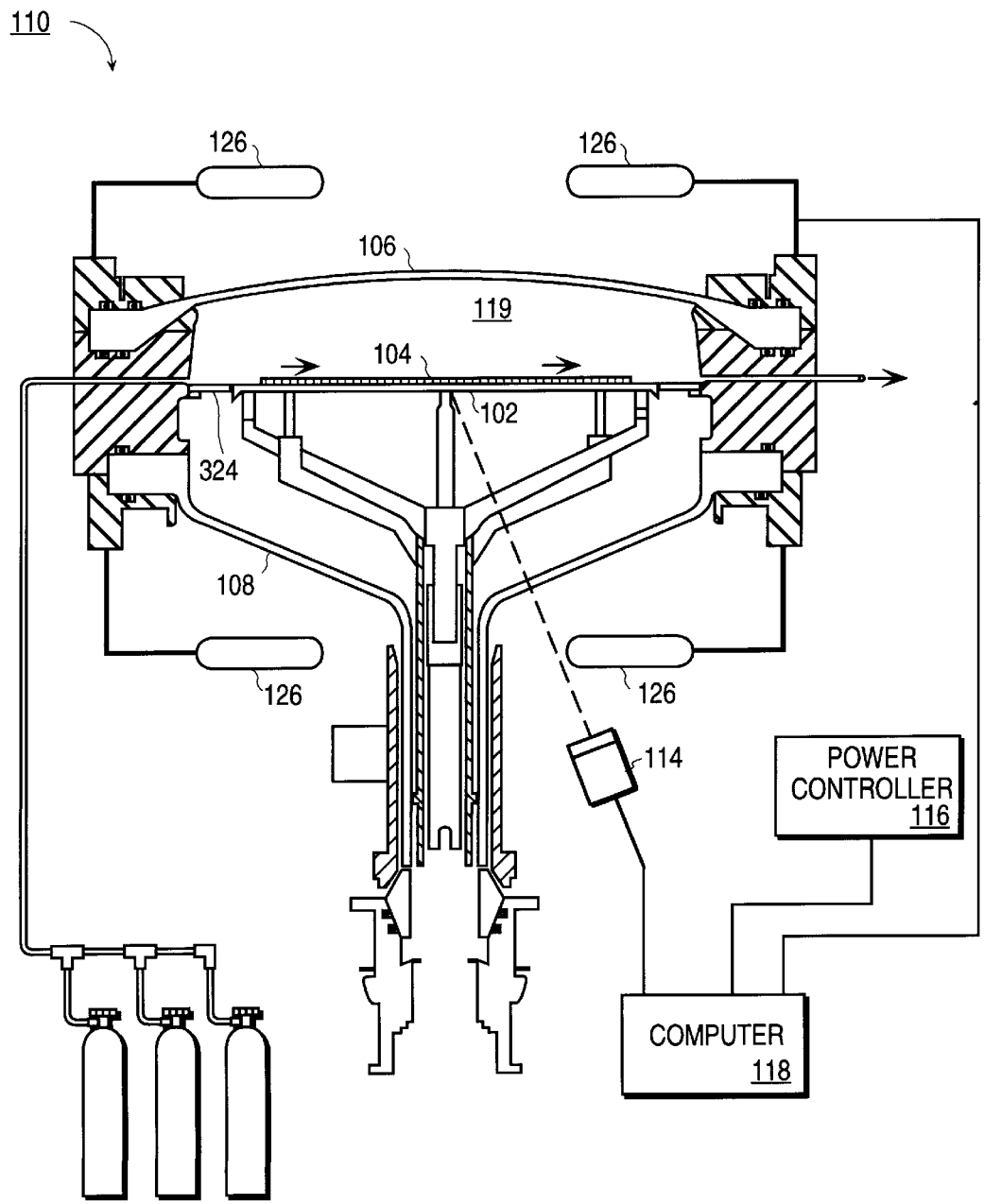
FIG. 1a is an illustration of a current single wafer deposition reactor.
Figure 1B:
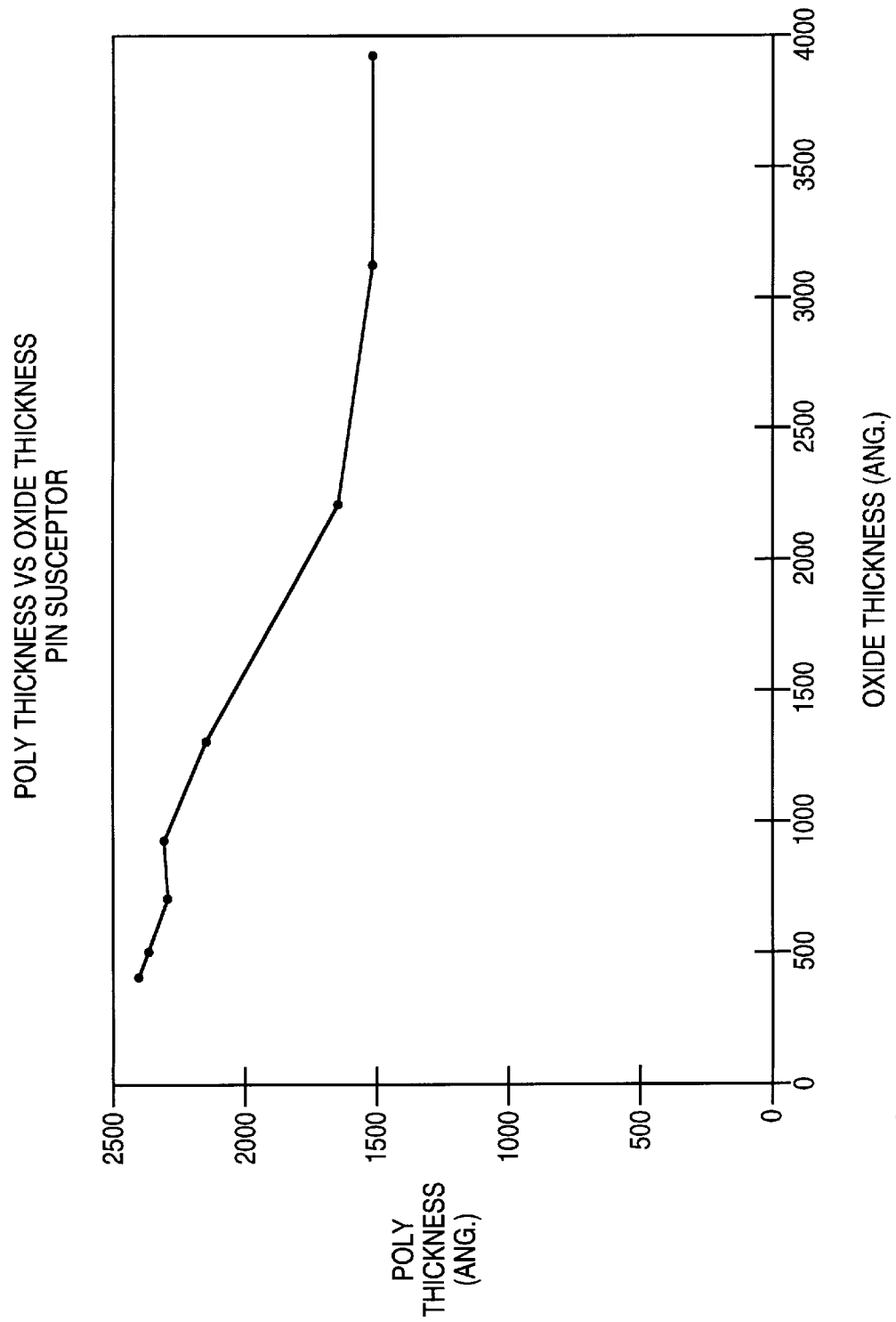
FIG. 1b is a graph showing how polysilicon deposition rate depends on oxide thickness in a current deposition reactor.
Figure 2:
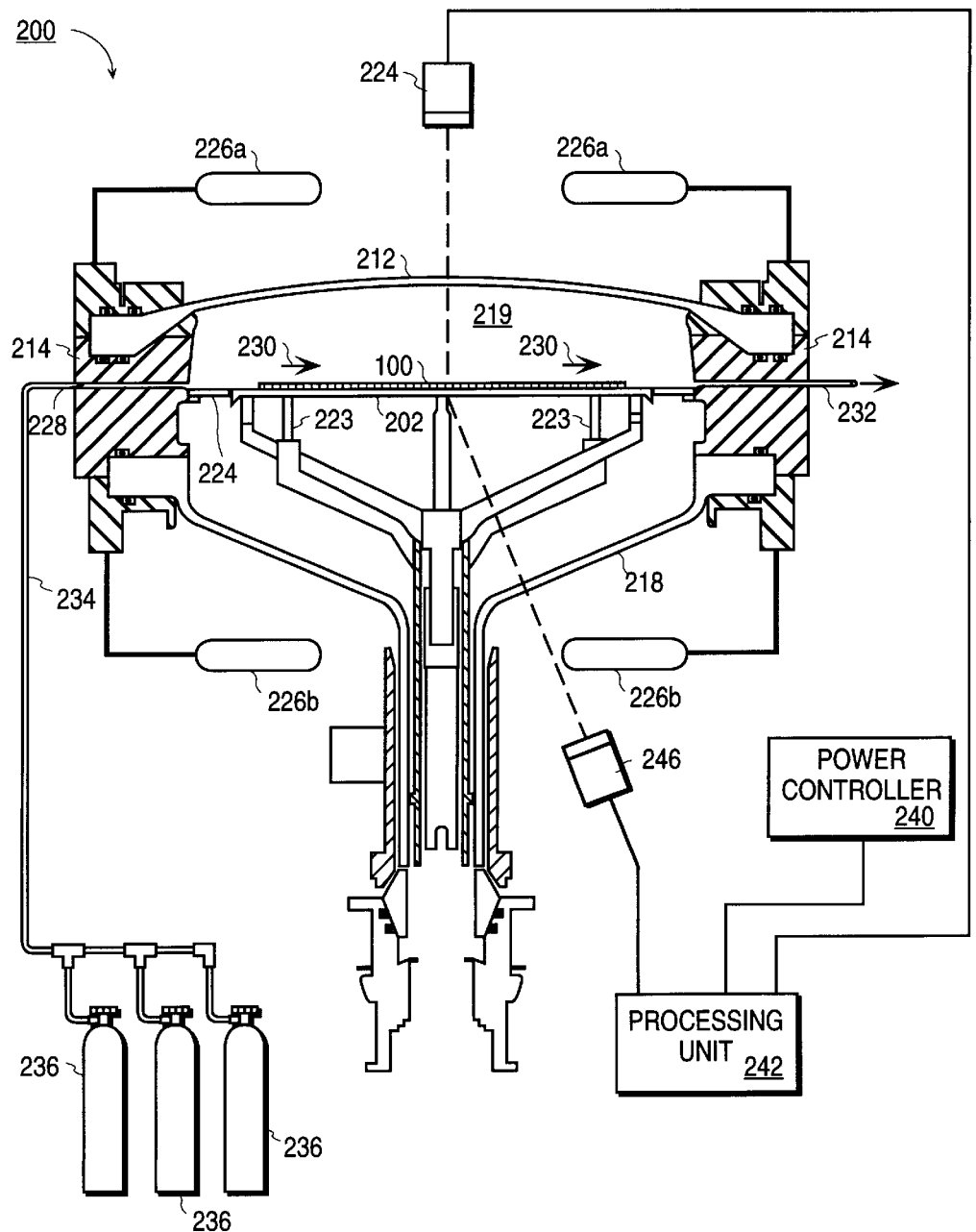
FIG. 2 is an illustration of a single wafer deposition reactor in accordance with the present invention.

FIG. 2 illustrates an example of the deposition apparatus of the present invention. The single substrate reactor 200, shown in FIG. 2, has a top 212, sidewalls 214, and a bottom 218 that define a chamber 219 into which a single wafer or substrate 100 can be loaded. A substrate or wafer 100 is mounted on a pedestal or susceptor 202 that is rotated by a motor (not shown) to provide a time average environment for the substrate 100 that is cylindrically symmetric. A susceptor circumscribing preheat ring 224 is supported by sidewalls 214 and surrounds susceptor 202 and substrate 100. Lifting fingers 223 pass through holes (not shown) formed through susceptor 202 to engage the underside of substrate 100 to lift it off susceptor 202. Substrate 100 and preheat ring 224 are heated by a heat source, such as but not limited to a plurality of high intensity lamps 226 mounted outside reactor 200. High intensity lamps 226 are preferably tungsten halogen lamps which produce infrared (IR) light at a wavelength of approximately 1.1 microns.

The top 212 and the bottom 218 of reactor 200 are substantially transparent to light to enable light from external lamps 226 to enter chamber 219 and heat susceptor 202, substrate 100, and preheat ring 224. Quartz is used for the top 212 and the bottom 218 because it is transparent to light at a visible and IR frequency; because it is relatively high strength material that can support a large pressure difference across it; and because it has a low rate of outgassing.

Chamber 219 is evacuated through exhaust port 232 by a pump (not shown) to reduce the pressure in chamber 219 from atmospheric pressure to a deposition pressure. During deposition, a reactant gas stream flows from a gas input port 228 across a preheat ring 224 where the gases are heated, across the surface of substrate 100 in the direction of the arrows 230 to deposit films thereon and out through exhaust port 232. The gas input port 228 is connected via a conduit 234 to a gas supply represented by tanks 236 that provides one of a mixture of gases. The gas concentration and/or flow rate through conduit 234 and each of the ports 228 and 232 are selected to produce processing gas flows in concentration profiles that optimize processing uniformity. The dominant shape of the profile is laminar flow from gas input port 228 and across the preheat ring 224 and the substrate 100 to exhaust port 232.

Semiconductor processing apparatus 200 has a temperature control apparatus which includes an upper heat source 226a, a lower heat source 226b, a power controller 240, a processing unit 242, a temperature measuring device 246 for measuring the temperature of susceptor 202, and a temperature measuring device 244 for measuring the radiation emission or apparent temperature of wafer 100.

Heat source 226 includes a top source of radiant energy 226a and a bottom source of radiant energy 226b. Heat source 226 preferably comprises a plurality of lamps divided into a top plurality of lamps 226a arranged in a circular array and an equivalent bottom plurality of lamps 226b, also arranged in a circular array. Lamps 226 emit radiation at a frequency at which the body to be heated absorbs radiation. In the presently preferred embodiment of the present invention, the body to be heated is a silicon wafer. Top lamps 226a are positioned to generally heat substrate 100 and a portion of the top of susceptor and top of preheat ring to 202 and bottom lamps 226b are arranged to generally heat the bottom of susceptor 202 and the bottom of preheat ring 224. It is to be appreciated that heat source 226 need not necessarily be a lamp or a plurality of lamps but can be other sources of heat such as but not limited to resistance heaters or rf induction heaters.

Power is provided to lamps 226 from a power controller 240. Power controller 240 can independently control the power applied to the top array of lamps 226a and the bottom array of lamps 226b and to subarrays of each, if desired. That is, power controller 240 can provide different percentages of the total power supplied to lamps 226 to the top and bottom arrays of lamps 226a and 226b. For example, if a process calls for a total power of 20 kw to be applied to lamps 226, a percentage of the power (say 45%) can be applied to the lower lamps while the remaining percentage of power (55%) is applied to the upper lamps. In this way different ratios of heat can be supplied to the top and bottom of susceptor 202.

A processing unit 242, such as a computer, is coupled to power controller 240 and outputs signals to power controller 240 detailing how much power to supply to lamps 226. Processing unit 242 is coupled to and receives input signals from temperature measuring device 246 relating to the present temperature of susceptor 202. Temperature measuring device 246 is preferably a pyrometer which measures radiation at the emission frequency of susceptor 202. Pyrometer 246 is located outside of reaction chamber 219 and directed towards the backside of susceptor 202. Since the emissivity of the backside of susceptor 202 does not change during processing (e.g., during film deposition), the backside of the susceptor provides a fixed surface from which the temperature of susceptor 202 can be accurately and reliably calculated.

Processing apparatus 200 of the present invention also preferably includes a device 244 which can measure the radiation emitted from the surface of wafer 100 at a given frequency. Device 244 is preferably a pyrometer located outside of chamber 219 and has a detection wavelength of 3.36–3.5 microns.

Processing unit 242 is preferably a computer having a central processor (CPU), a volatile and a non-volatile memory, such as DRAMS and ROMS, and input and output devices, such as a keyboard and a display terminal. A temperature control algorithm in the form of executable code is stored in non-volatile memory for execution by the central processor of processing unit 242. The temperature control algorithm of the present invention manages and controls the temperature control apparatus of semiconductor processing apparatus 200. It is to be appreciated that processing unit 242 need not necessarily be a computer comprising a processor and memory, and can be other suitable devices such as, but not limited to, hardwired logic, programmable logic devices, and neutral networks. Any device which is capable of receiving temperature inputs, executing specified steps, and providing power output signals can be utilized as processing unit 242.

The temperature control algorithm of the present invention includes an algorithm, such as a well known PID algorithm, which can be used to determine the amount of Total Power (or heat) to apply in order to reach or maintain a given susceptor temperature. (Total Power is the sum of the power applied to top heat source and the power applied to bottom heat source.)

Figure 9:
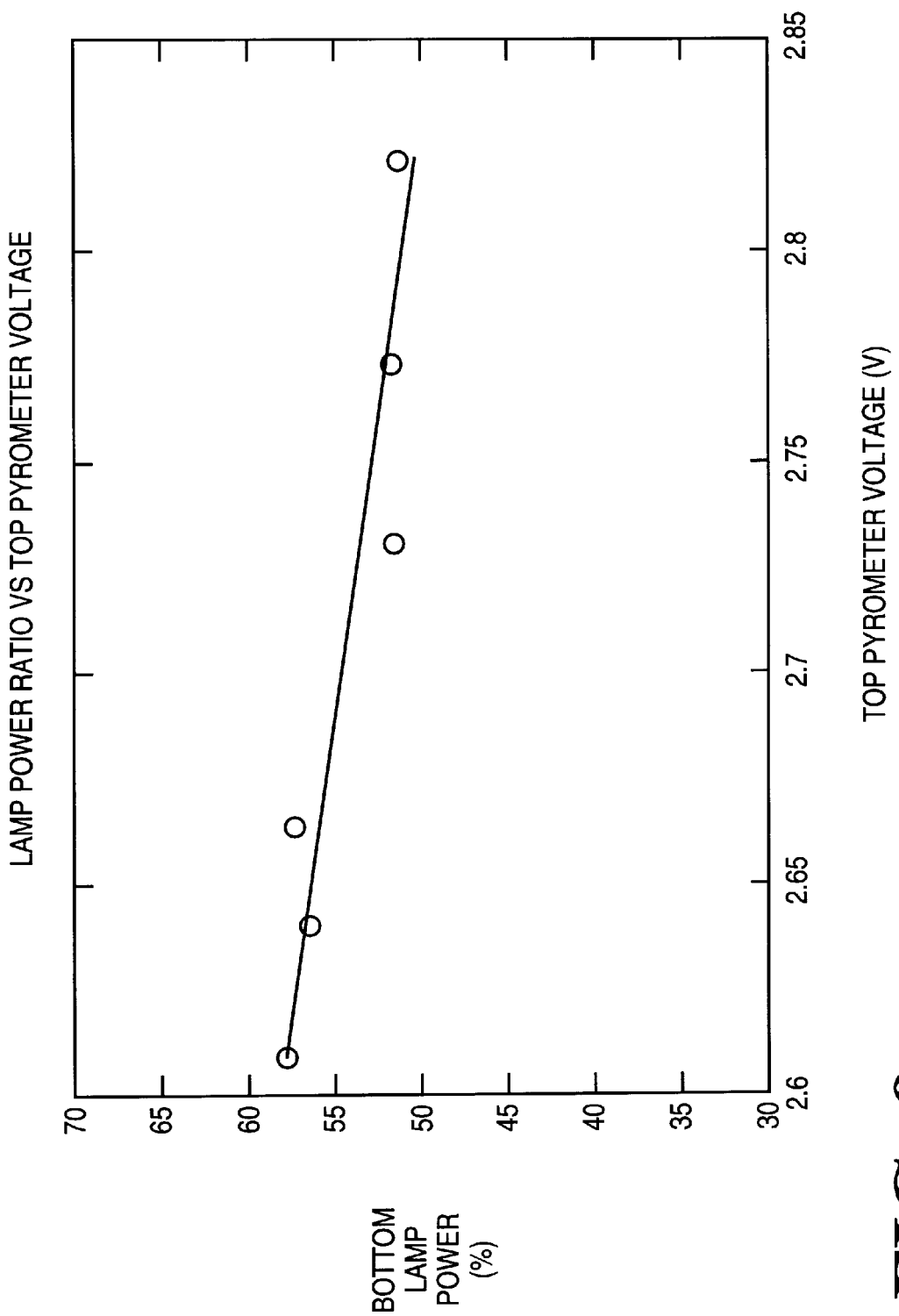
FIG. 9 is an illustration of a graph which provides power ratios for specific pyrometer voltages in order to provide constant deposition rates.

Additionally, the temperature control algorithm of the present invention includes, in the form of a empirically determined look up table, graph or equation, a plurality of power ratios (i.e., the percentage of the total power which is applied to the upper heat source and the lower heat source) which, when applied to lamps 226a and 226b, will make the deposition rate of a process substantially independent of the specifics of a wafer characteristic. In the preferred embodiment of the present invention the wafer characteristic is represented by its radiation emission at a given susceptor temperature, and more specifically by a voltage level generated by pyrometer 244. An example of a graph which defines power ratios or power balances which will provide a constant deposition rate for different pyrometer voltages is illustrated in FIG. 9.

Figure 8A:
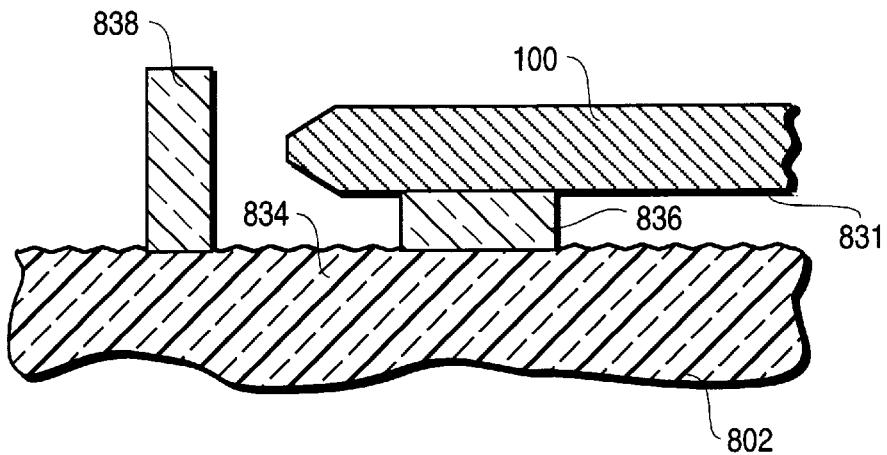
FIG. 8a is an illustration of a cross-sectional view of a pin susceptor.
Figure 8B:
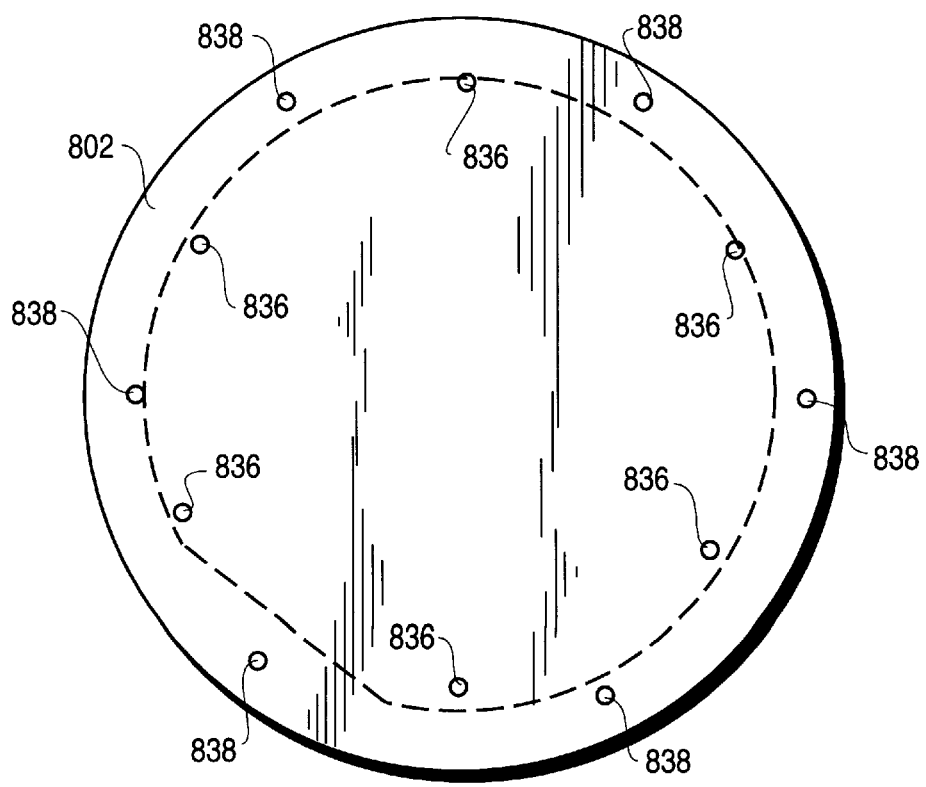

Referring to FIG. 8a there is shown a sectional view of one form of a susceptor 202 in accordance with the present invention. Susceptor 202 is preferably a "pin susceptor" circular plate having a relatively flat top surface 834 and a shaft (not shown) secured at the center of its bottom surface. Projecting upwardly from the top surface 834 are a plurality of support posts 836. The support posts 836 are spaced in relation around a circle which is of a diameter slightly less than the diameter of wafer 100 to be treated on susceptor 202. There should be at least three supporting posts 836, and as shown in FIG. 8b, there are preferably six support posts 836 on susceptor 202. Thus, the support posts 836 are adapted to support a wafer 100 thereon with the back surface 831 of the wafer 100 being slightly spaced from the top surface 834 of the susceptor 202.

The support posts 836 link to space the back surface 831 of the wafer 100 from the top surface 834 of susceptor 202, a distance sufficient to allow molecules of the deposition gas to fuse completely across the back surface of wafer 300. In this way a film can be deposited on the back surface of wafer 100.

The spacing, however, must be close enough to provide for a significant portion (at least half of the heat transfer from the susceptor 202 to the wafer 100 to be conduction; that is, a spacing must minimally be of a value to retain heat conduction coupling between the heated susceptor 202 and wafer 100 to be coated. However, since wafer 100 is spaced from the surface of 834 of susceptor 202, radiation heat transfer becomes much more important than when the wafer is directly on the surface of the susceptor, making broad contact therewith.

While the length of the support pins 836 can be of any value that achieves a heat coupling between susceptor 202 and wafer 100 to accomplish the full coverage coating of the wafer substrate, typical lengths range from 0.5 mm to 10 mm. Preferred wafer coatings results have been found with the pin lengths of 1 mm to 6 mm.

The diameter of support pins 836 should be sufficient to provide good support for the wafer 100, but not large enough to cover a significant area of back surface 831 of the wafer 100. A typical diameter for the support pins 836 is from 1 mm to 3 mm.

Also projecting from the top surface 834, susceptor 202 are a plurality of retaining pins 838. The retaining pins 838 are arranged in space relation around a circle which is a diameter of slightly larger than the diameter of wafer 100 to be treated on susceptor 202. Although three of the retaining pins 838 can be used, as shown in FIG. 8b, six of the retaining pins 838 are preferred. The retaining pins 838 are of a length longer than the length of the support pins 836, preferably by a distance at least equal to the thickness of wafer 100. Typically, the retaining 838 are of a length of at least ½ mm longer than the length of support pins 836.

Figure 3:
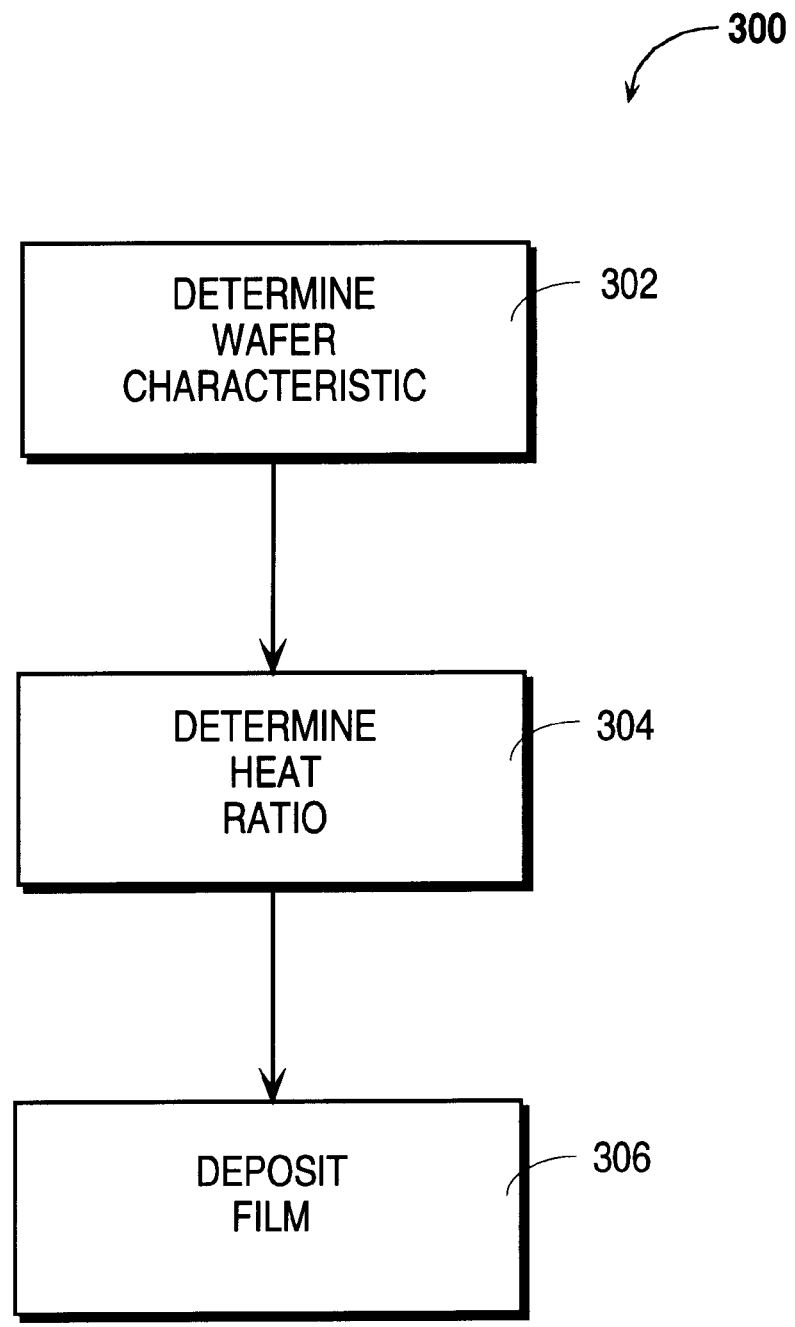
FIG. 3 is a flow chart detailing a method of depositing a film in accordance with the present invention.

A method of depositing a film utilizing the apparatus of FIG. 2 is illustrated in the flow chart 300 of FIG. 3. According to the present invention, the first step as set forth in block 302, is to determine the specifics of a wafer characteristic. The characteristic may, for example, be the thickness of a dielectric layer formed across a wafer. In other instances the characteristic may the density of vias or electrode patterns formed across the wafer. In still other instances the characteristic may be the surface roughness of a film formed across the wafer. In still yet other instances the characteristic might be the doping level of wafer 100 or of a film formed on wafer 100. It is to be appreciated that each of these characteristics affect the emissivity of a wafer which therefore affects the surface temperature of the wafer which in turn affects the deposition rate of a film formed thereon.

The preferred method of determining the specifics of a wafer characteristic is to measure the optical emission of the wafer while the wafer is on susceptor 202 held at a defined temperature. That is, according to the preferred embodiment of the present invention, a wafer characteristic is inferred by monitoring the optical emission of a wafer at a given frequency, preferably between 3.36–3.5 microns, while the wafer is held at a predefined temperature. It is to be appreciated that characteristics such as a film thickness, pattern density, surface roughness, and doping level each affect the emissivity of a wafer and so their specific values can therefore be indirectly measured by monitoring the optical emission of wafer 100 with device 244.

For discussion purposes only, the specific characteristic measured will be is the thickness of an oxide layer grown over a silicon wafer. Thus, according to the present invention, the first step is to measure the thickness of a grown oxide formed on wafer 100 (e.g., determining whether the oxide film is 100 Å, 1,000 Å, 5,000 Å, etc.). The measured thickness of the oxide layer is then provided to processing unit 242. The preferred method of determining the thickness of the oxide layer is to measure the optical emission of wafer 100 while at a defined susceptor temperature. It is to be appreciated that the optical emission of the wafer depends upon the thickness of the oxide film formed over its surface.

According to the preferred method, wafer 100 is placed on susceptor 202 and susceptor 202 raised to a predetermined temperature by applying power to lamps 226a and 226b. The susceptor temperature is maintained for a predetermined amount of time to allow wafer 100 to obtain a steady state.

Pyrometer 244 then measures, for a given period of time, the amount of power radiating from the wafer at a specific frequency, and generates a voltage which is related to the wafer's emitted radiation. The voltage is then provided from pyrometer 244 to processing unit 242. Since the emitted radiation of wafer 100 is related to the thickness of the oxide formed thereon, the voltage generated by pyrometer 244 is directly related to the oxide thickness. Because susceptor 202 has a known fixed emissivity, its calibrated temperature provides a good reference point from which to monitor the difference in wafer radiation emission due to different wafer characteristics.

Figure 4:
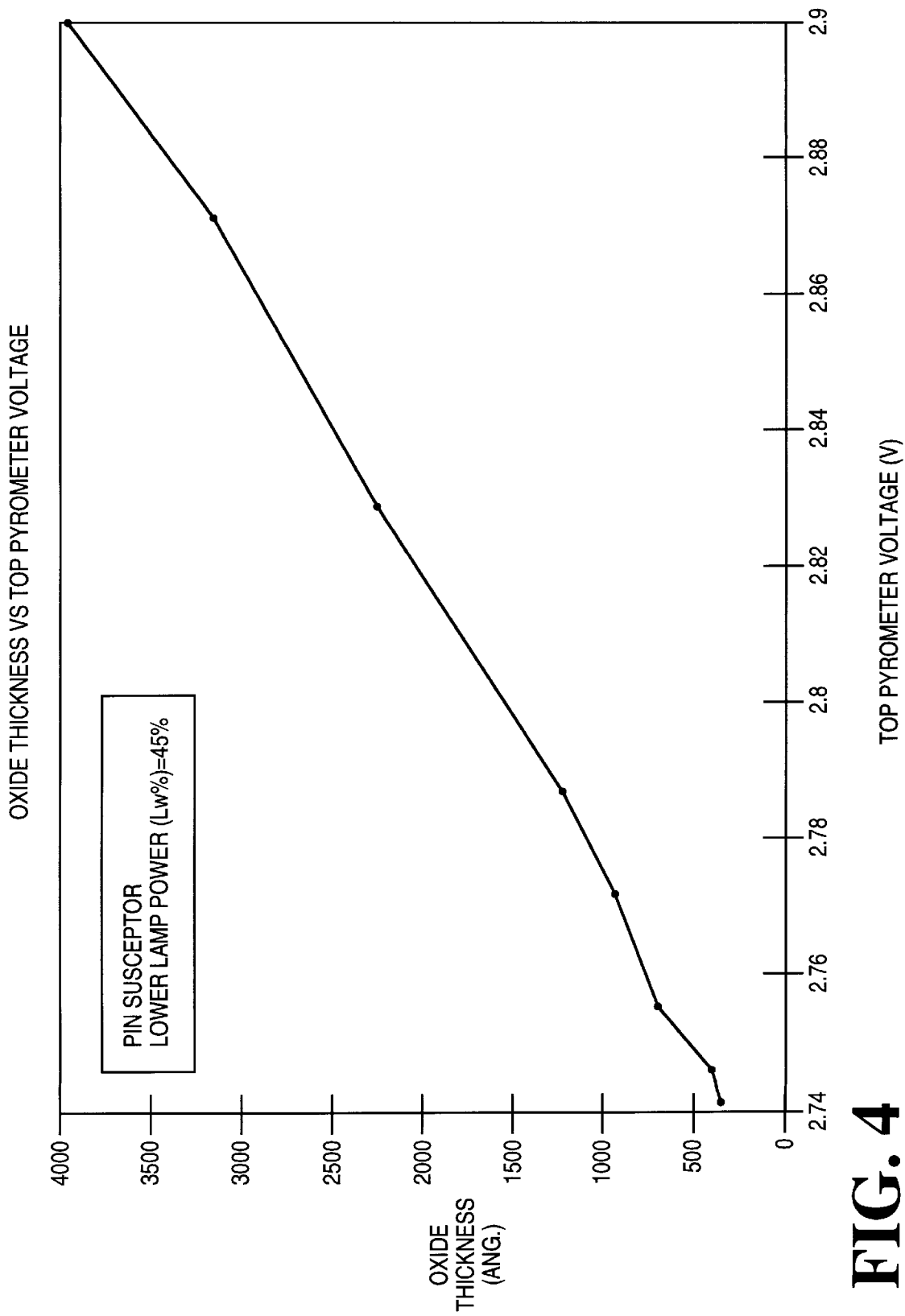
FIG. 4 is a graph which shows the relationship between pyrometer voltage and the thickness of an oxide formed over a wafer surface.

FIG. 4 is a graph which illustrates how oxide thickness is related to the voltage of pyrometer 244. The graph of FIG. 4 can be easily generated by recording, under constant conditions (i.e., power, pressure, flow rates, etc.), the voltage measured from a plurality of different wafers having different known oxide thicknesses. The relationship of pyrometer voltage to oxide thickness can then be included in the form of a look-up table, or equation in the temperature control algorithm of the present invention so that oxide thickness can be determined from pyrometer voltage.

It is to be appreciated that using pyrometer 244 is a preferred method of monitoring the thickness of the oxide film formed on the surface of wafer 100 because it allows an insitu measurement of film thickness (i.e., the thickness measurement is made in the same chamber as is used to deposit a film on wafer 100). Insitu oxide thickness measurement increases the wafer throughput. It is to be noted, however, that other well known techniques, such as direct measurement, can be used to determine oxide thickness prior to placing wafer 100 into chamber 219.

The next step according to the present invention, as set forth in block 304 of flow chart 300, is to determine the ratio or balance of heat to be supplied from the top heat source 226a compared to the lower heat source 226b which will make the rate of the deposition process independent of the wafer characteristic. That is, according to the present invention, different ratios of heat are supplied from the top heat source relative to the bottom heat source in order to compensate for the dependence of deposition rate on a specific wafer characteristic. In the apparatus of FIG. 2 different ratios of heat are supplied above and below the susceptor by providing different amounts of power to the upper lamps 226a relative to the lower lamps 226b.

Accordingly, for the present example, stored in memory of processing unit 242 is a look-up table chart which provides a power ratio to be applied to upper lamps 226a and lower lamps 226b which will make the deposition rate constant under given conditions (i.e., constant pressure, total power, flow rates, etc.) regardless of the thickness of the grown oxide. That is, stored within processing unit 242 is a table, graph, or equation, such as the graph shown in FIG. 5 which provides a ratio of power to be applied to lamps 226a and 266b which will, for each oxide thickness, make the deposition rate of a given process independent of the oxide film thickness.

Figure 6:
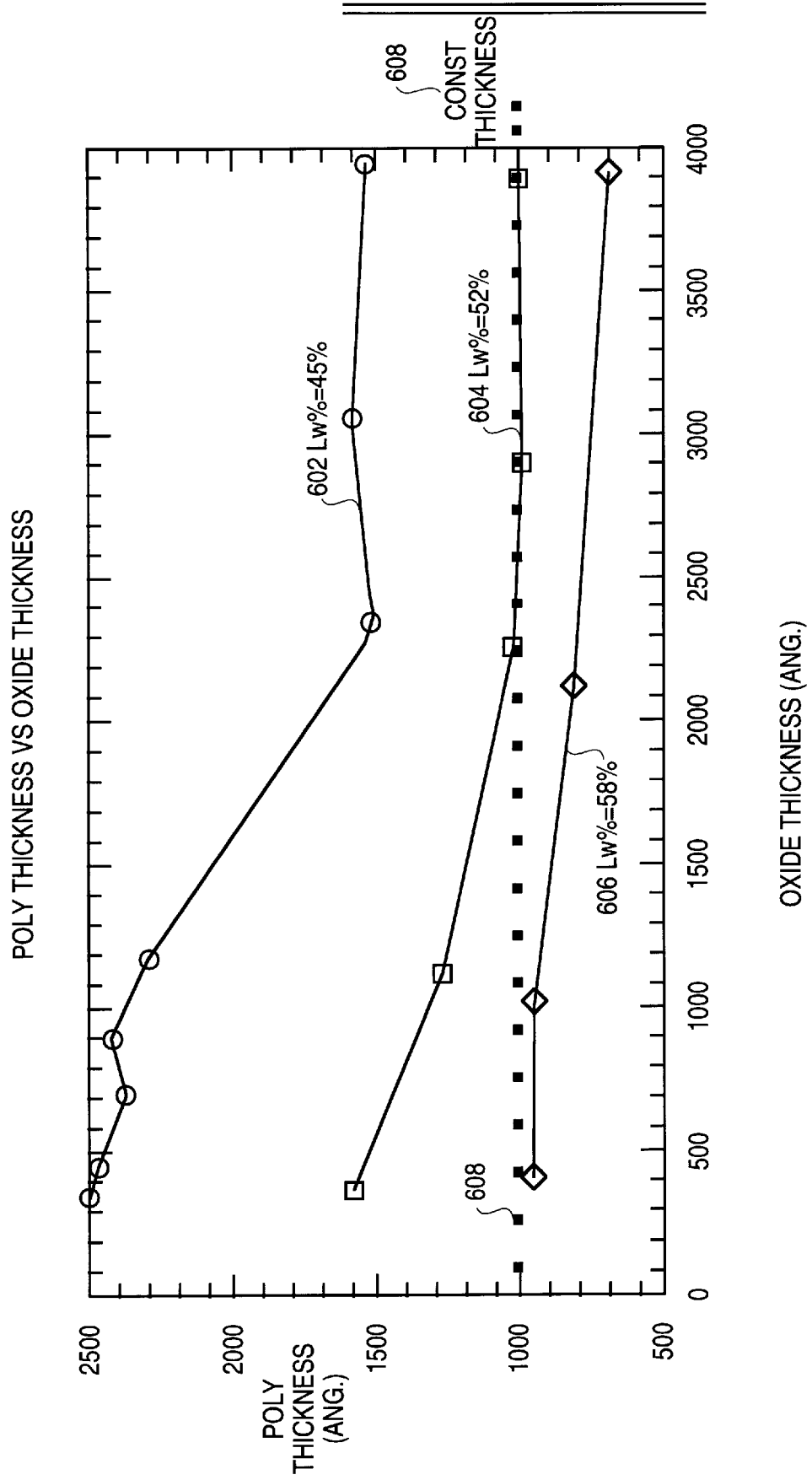
FIG. 6 is an illustration of a graph showing polysilicon thickness dependence on oxide thickness for various power ratios.

In order to determine power ratios which will provide a polysilicon deposition rate which is independent of oxide film thickness, a plurality of different polysilicon thickness vs. oxide thickness plots are generated as illustrated in FIG. 6. A separate plot is generated for each different power ratio as shown in FIG. 6. That is, for each power ratio a standard constant polysilicon deposition process is carried out (i.e., constant time, power, pressure, flow rates, etc.) on wafers having different oxide thicknesses. The resulting deposition thickness is then recorded for each oxide thickness. FIG. 6 illustrates a plot 602 wherein 45% of the total power supply to lamps 226a and 226b is supplied to lower lamps 226b, a plot 602 where 52% of the total power is supplied to lower lamps 226b, and a plot 606 where 58% of the total power is supplied to lower lamps 226b.

A line of constant deposition thickness is then chosen and plotted on the graph of FIG. 6. For example, FIG. 6 shows a line 608 for 1,000 Å constant deposition thickness. The intersections of plots 602–606 with 608 provide the specific power ratios which will provide a deposition thickness of 1,000 Å for any given oxide thickness. In the case where no plot (602–606) passes through the constant thickness line 608 for a given oxide thickness, the power ratio can be extrapolated from the nearest plots above and below.

Figure 5:
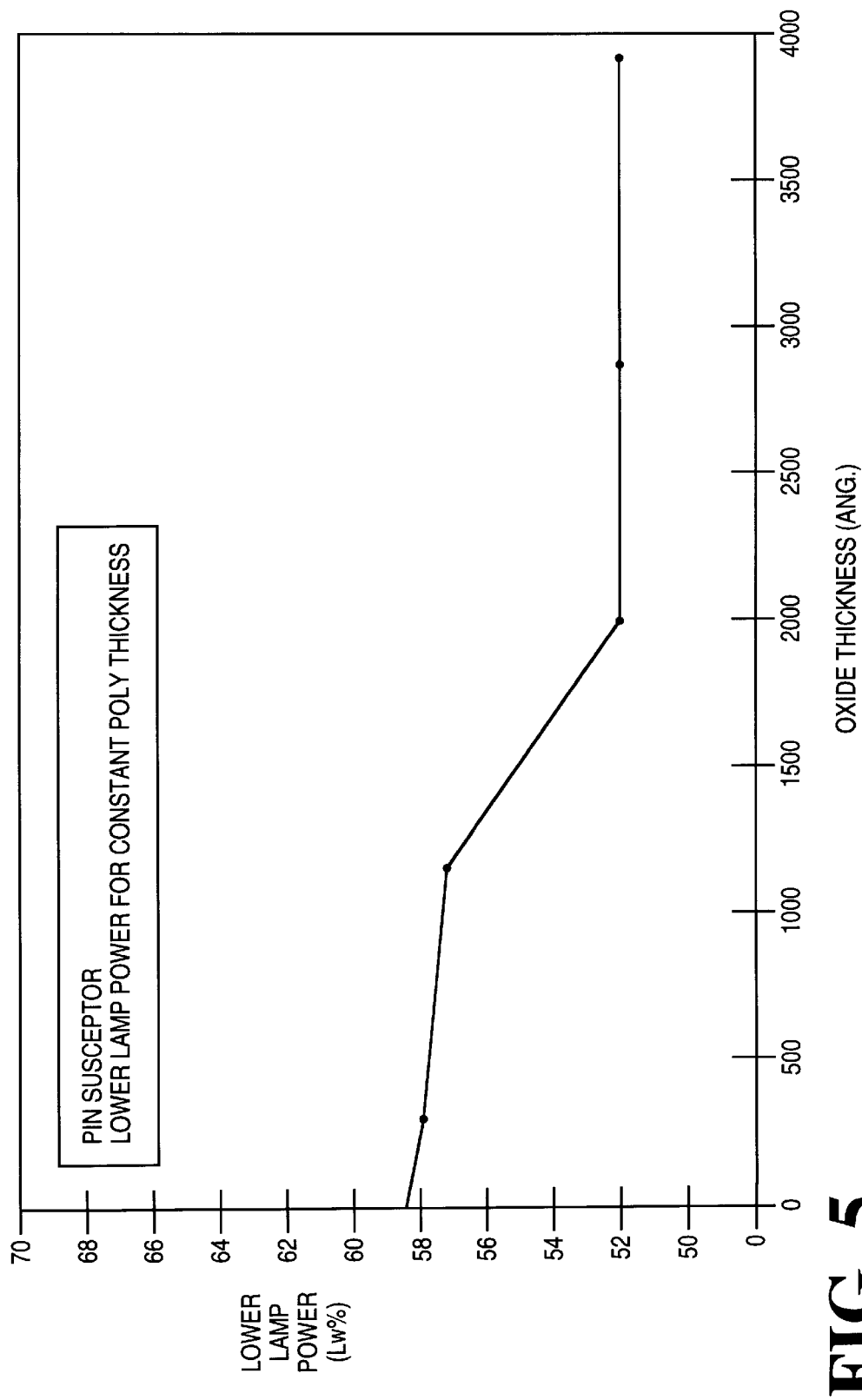
FIG. 5 is an illustration of a graph which provides power ratios for specific oxide thickness in order to provide constant deposition rates.

A plot of the power ratios (which provide a constant deposition thickness) versus oxide thickness can then be generated as shown in FIG. 5. It is to be appreciated that the greater number of power ratio plots (602–606) generated in the more accurate will be the power ratio versus oxide thickness plot of FIG. 5.

After determining the power ratio or power balance which will obtain a constant deposition rate for a given oxide thickness, a film is deposited over the wafer as set forth in block 306. In order to deposit a film on wafer 100, wafer 100 is brought to the desired deposition temperature. Deposition temperature is reached by monitoring the temperature of susceptor 202 with pyrometer 246 and increasing, decreasing or maintaining the amount of Total Power applied to lamps 226a and 226b until susceptor 202 reaches the deposition temperature. Because the backside of susceptor 202 has a known and fixed emissivity, even during film deposition, its temperature, or more specifically its radiation emission, provides a good baseline for determining the amount of total power or total heat necessary to reach the deposition temperature for wafer 100. In order to deposit a polysilicon film, a Total Power is applied to lamps 226a and 226b in order to heat susceptor 202 and wafer 100 to a process temperature typically between 550° C. and 700° C.

During film deposition the Total Power is applied to lamps 226a and 226b in the ratio which was specified in step 302.

To deposit a polysilicon layer deposition gas 230 will include a silicon source gas, such as silane ($SiH_4$) and a dopant gas source such as phosphine ($PH_3$) and a carrier gas such as $H_2$. The deposition gas is fed into chamber 219 from gas inlet 228. The deposition gas flows across preheat ring 224 susceptor 202 and wafer 100 and out through exhaust passage 232. A vacuum source coupled to exhaust outlet 232 maintains the chamber 219 at a reduced or low deposition pressure of between 10–200 torr. Once the desired amount of polysilicon has been deposited onto wafer 100, the process is complete.

Figure 7:
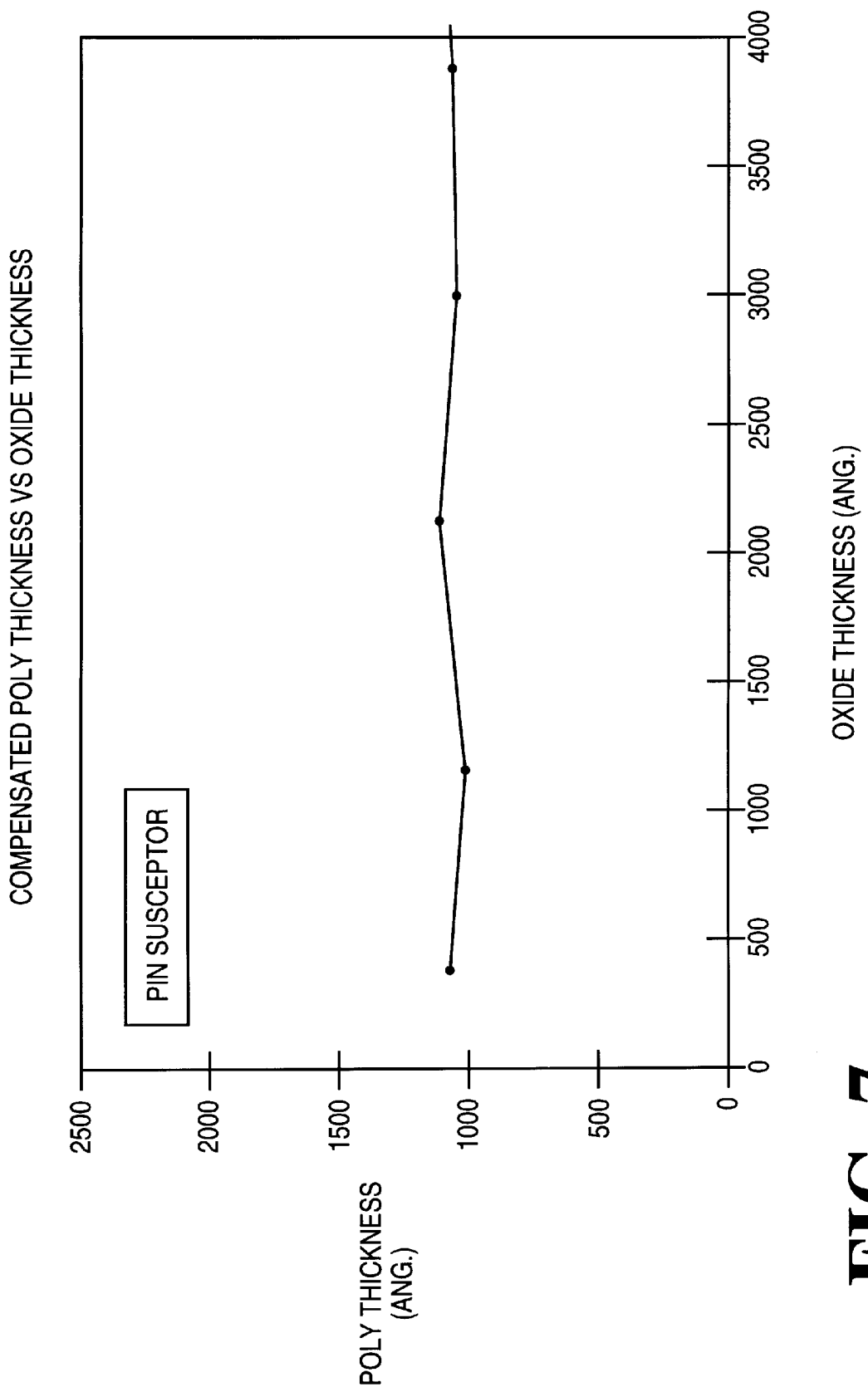
FIG. 7 is an illustration of a graph which shows how polysilicon deposition rate is independent of oxide thickness when utilizing the process and apparatus of the present invention.

The process 300 set forth in FIG. 3 is then repeated for a number of different wafers. In each case the oxide thickness formed across the wafer is measured or entered, and a corresponding power ratio determine which will provide a constant deposition rate. In this way the deposition rate for each wafer is constant regardless of the initial oxide thickness formed thereon. That is, the present invention makes the polysilicon deposition rate independent of the initial oxide thickness formed on wafer 100. By making the deposition process independent of, or transparent to, initial oxide thickness, wafer to wafer uniformly is substantially improved. The result of the present invention is illustrated in FIG. 7 wherein the polysilicon deposition rate is shown to be constant regardless of oxide thickness.

Thus, according to the present invention, the susceptor temperature is monitored and used to determine the total amount of power or heat to apply in order to reach a specific deposition or process temperature. The Total Power (or total amount of heat) is applied in an empirically determined ratio above and below the susceptor in order to counter differences in surface temperature due to differences in wafer emissivity due to different wafer characteristics (e.g., oxide thickness). That is the present invention utilizes different balances of heat from above and below the susceptor in order to counter differences in wafer emissivities and thereby make the deposition rate of a given process constant and independent of wafer characteristics.

A method and apparatus for making the deposition rate a process independent or transparent to a wafer characteristic has been described. It is to be appreciated that the present invention has been described with respect to a specific wafer characteristic (i.e., oxide thickness formed thereon) and a particular deposition process (polysilicon deposition). The present invention, however, is equally useful for making a deposition process independent of other wafer characteristics. For example, the present invention can be used to make the present deposition rate independent of the density of patterns formed over a wafer, or independent of the surface roughness of a layer formed over a wafer, or independent of the doping level of the wafer or film formed thereon. In such a case graphs or relationships such as shown in FIGS. 4, 5 and 6 would be generated as set forth above, with respect to the specific wafer characteristic (e.g., doping level, surface roughness, etc.) instead of oxide thickness.

Additionally, it is to be appreciated that the optical emission of wafer 100 can also be used to determine the specifics of other wafer characteristics, such as pattern density, surface roughness, doping levels, etc., because variations in these characteristics, each affect the optical emission of wafer 100. As such a device such as a pyrometer 244 can be used to monitor these wafer characteristics also. It is to be appreciated that like oxide thicknesses, the specifics of the wafer characteristic need not necessarily to be monitored by pyrometer 244 but can be measured by other well known techniques prior to the wafer being placed within chamber 219 if desired. For example, a simple microscope can be used to determine pattern density or surface roughness prior to film deposition.

One skilled in the art will appreciate that instead of a look-up table or graph which depicts different power ratios for different specific wafer characteristics (e.g., oxide thickness), a look-up table or graph having power ratios for different pyrometer voltages or currents or power ratios for different wafer radiation emissions may be utilized. For example, it may be desirable to utilize a look up table or equation which defines power ratios which will obtain uniform film deposition for different pyrometer voltages such as shown in FIG. 9. An advantage of utilizing a relationship between pyrometer voltage and power ratios is that such a relationship utilizes the direct relationship between the optical emission of a wafer and the pyrometer voltage level. Such a method eliminates the need to infer a specific wafer characteristic (e.g., oxide thickness) from the pyrometer voltage and then utilize the inferred thickness to determine the proper power ratio. Additionally, utilizing pyrometer voltage/power ratio relationship such as shown in FIG. 9, enables a generic method to compensate for any surface characteristic (i.e., not just a single characteristic) which affects wafer emissivity and therefore surface temperature. A graph similar to FIG. 9 can be generated as discussed with respect to FIG. 6. That is, a graph similar to FIG. 9 can be generated by recording for a plurality of different power ratios, the deposition thickness of a film carried out under constant conditions on wafers having different pyrometer voltages. A line of constant deposition thickness can then be plotted to determine the power ratios which will yield a constant deposition rate for different pyrometer voltages.

Additionally, it is to be appreciated that the present invention can be used to make the deposition rate of processes other than polysilicon such as but not limited to amorphous silicon, epitaxial silicon, or metal layers independent of the specifics of a wafer characteristic. Still further, the present invention is generally applicable to any thermal process, such as reactive ion etching, where the surface temperature of a wafer can affect process results or repeatability. As such, the details outlined herein are to be taken as illustrated, rather than limiting, wherein the scope of the present invention is to be determined by appended claims which follow.

Thus, a method and apparatus for making the deposition rate of a process independent of a wafer characteristic has been described.

We claim:

1. A method of processing a substrate, said method comprising the steps of:

providing a predetermined relationship between the specifics of a substrate characteristic and a ratio of heat from an upper heat source and a lower heat source which will make said processing substantially independent of the specifics of the substrate characteristic;

measuring a specific characteristic of said substrate;

determining from said predetermined relationship and said measured specific substrate characteristic a ratio of heat which will make said processing independent of said measured specific substrate characteristic; and applying a ratio of heat while exposing said substrate to said processing.

2. The method of claim 1 wherein said substrate characteristic is an optical characteristic of said substrate.

3. The method of claim 1 wherein said optical characteristic is the radiation emission of said substrate.

4. A method of depositing a film on a substrate comprising the steps of:

placing a substrate in a chamber having an upper source of radiant energy and a lower source of radiant energy;

providing a predetermined relationship between radiation emission characteristic and ratios of power for said upper source of radiant energy and said lower source of radiant energy which will make depositing a film on said substrate independent of the radiation emission of said substrate;

measuring the radiation emission of said substrate;

determining from said predetermined relationship and said measured radiation emission a ratio of power which will make said deposition process independent of the measured radiation emission of said substrate; and applying said ratio of power while depositing said film on said substrate.

5. The method of claim 4 wherein said upper source of radiant energy and said lower source of radiant energy are a plurality of lamps.

6. The method of claim 4 wherein said step of measuring the radiation emission of said substrate comprises the steps of:

providing a first amount of power to said upper and lower source of radiant energy; and reading the voltage of a pyrometer directed at said substrate in said chamber.

7. A method of depositing a silicon film on a wafer having a dielectric layer formed thereon, said method comprising the steps of:

measuring the thickness of said dielectric layer;

placing said wafer in a chamber having an upper and a lower source of radiant energy;

providing a predetermined relationship between dielectric thickness and ratios of power for said upper and lower sources of radiant energy which will make said silicon film deposition process substantially independent of the thickness of the dielectric layer formed on said wafer;

determining from said predetermined relationship and said measured dielectric layer thickness a ratio of power which will make said silicon deposition process independent of said measured thickness of said dielectric on said wafer; and applying said ratio of power while depositing said silicon film on said wafer.

8. The method of claim 7 wherein said dielectric layer is an oxide.

9. The method of claim 7, wherein said step of measuring the thickness of said dielectric layer comprises the step of:

measuring the radiation emitted from said dielectric layer with a pyrometer directed at said dielectric layer when said wafer is located in said chamber.

10. A method of depositing a polysilicon film on a top surface of a silicon wafer having an oxide layer formed thereon, said method comprising the steps of:

supporting said wafer in proximity to but not in broad contact with a susceptor in a process chamber wherein an upper array of lamps is positioned above said susceptor and a lower array of lamps is positioned below said susceptor;

providing a predetermined relationship between optical emission of said wafer and the ratio of power to be applied to said upper and lower sources of radiant energy which will make said polysilicon film deposition process substantially independent of the optical emission of said wafer;

measuring the optical emission of said top surface of said wafer prior to depositing said polysilicon film;

determining from said predetermined relationship and said measured optical emission a ratio of power which will make said polysilicon deposition process independent of said measured optical emission of said wafer; and applying said ratio of power to said upper array lamps and to said lower array lamps while depositing said polysilicon film.

11. A method of processing a substrate comprising:

placing a substrate on a susceptor in a chamber having an upper heat source and a lower heat source;

providing a predetermined relationship between a substrate characteristic and a power ratio to said upper heat source and said lower heat source which will make said processing substantially independent of of said substrate characteristic;

measuring a characteristic of said substrate;

determining from said predetermined relationship and said measured substrate characteristic a ratio of power which will make said processing independent of said measured substrate characteristic; and applying a total power to said upper heat source and to said lower heat source wherein said total power is chosen to obtain a susceptor process temperature and wherein said total power is applied to said upper heat source and said lower heat source in said ratio.

* * * * *